(12) United States Patent
Chia et al.

(10) Patent No.: US 8,035,127 B2
(45) Date of Patent: Oct. 11, 2011

(54) PACKAGING SUBSTRATE STRUCTURE WITH A SEMICONDUCTOR CHIP EMBEDDED THEREIN

(75) Inventors: Kan-Jung Chia, Hsin-Chu (TW); Shang-Wei Chen, Hsin-Chu (TW)

(73) Assignee: Unimicron Technology Corp., Taoyuan (TW)

( * ) Notice: Subject to any disclaimer, the term of this patent is extended or adjusted under 35 U.S.C. 154(b) by 403 days.

(21) Appl. No.: 12/055,478

(22) Filed: Mar. 26, 2008

(65) Prior Publication Data
US 2008/0237836 A1 Oct. 2, 2008

(30) Foreign Application Priority Data

Mar. 27, 2007 (TW) .............................. 96110461 A (51) Int. Cl.
*H01L 29/73* (2006.01)
(52) U.S. Cl. ........ 257/178; 257/633; 257/747; 257/705; 257/E23.001; 438/107; 438/406
(58) Field of Classification Search .................. 257/178, 257/633, 747, 705, E23.001, E33.056; 438/107, 438/406
See application file for complete search history.

(56) References Cited

U.S. PATENT DOCUMENTS

| | | | |
|---|---|---|---|
| 2002/0173133 A1* | 11/2002 | Towle et al. | 438/612 |
| 2006/0060984 A1* | 3/2006 | Wakabayashi et al. | 257/780 |
| 2008/0054443 A1* | 3/2008 | Shih | 257/698 |

FOREIGN PATENT DOCUMENTS

JP 2002-246501 * 8/2002

* cited by examiner

*Primary Examiner* — Thanh V Pham
(74) *Attorney, Agent, or Firm* — Schmeiser, Olsen & Watts LLP (57) ABSTRACT

A packaging substrate structure with a semiconductor chip embedded therein is disclosed, including a carrier board having a first and an opposed second surfaces and disposed with at least a through cavity; a semiconductor chip received in the through cavity, the chip having an active surface and an inactive surface opposite to one another, wherein the active surface has a plurality of electrode pads, a passivation layer is disposed on the active surface with the electrode pads exposed from the passivation layer, and metal pads are disposed on surfaces of the electrode pads; a buffer layer disposed on the first surface of the carrier board and on surfaces of the passivation layer and the metal pads; a first dielectric layer disposed on the buffer layer; and a first circuit layer disposed on the first dielectric layer and electrically connected with the metal pads of the chip via first conductive structures disposed in the buffer layer and the first dielectric layer, wherein the CTE (Coefficient of Thermal Expansion) of the buffer layer is between the CTE of the semiconductor chip and the CTE of the dielectric layer. Thereby, the buffer layer can reduce the stress on the interface between the dielectric layer and the semiconductor chip.

9 Claims, 6 Drawing Sheets

PACKAGING SUBSTRATE STRUCTURE WITH A SEMICONDUCTOR CHIP EMBEDDED THEREIN

BACKGROUND OF THE INVENTION

1. Field of the Invention

The present invention relates generally to a packaging substrate structure with a semiconductor chip embedded therein, and more particularly, to a packaging substrate structure with a semiconductor chip embedded therein having a buffer layer.

2. Description of Related Art

With the rapid development of semiconductor package technologies, there have been developed various kinds of packages for semiconductor devices, which mainly involves mounting a semiconductor chip to a packaging substrate, electrically connecting the semiconductor chip to the packaging substrate and encapsulating the whole structure. Therein, BGA (Ball Grid Array) package technology is a developed package technology, which is characterized in that one side of a packaging substrate is mounted with a semiconductor chip and the other side of the packaging substrate is mounted with a plurality of solder balls arranged in an array such that more I/O connections can be accommodated in a unit area of the chip carrier. Further, the whole package can be electrically connected to a printing circuit board through the solder balls.

Although such a structure achieves a high pin count, as the semiconductor chip is electrically connected to the substrate by wire bonding or flip chip, the relatively long conductive wire connection paths increase impedance during high-frequency or high-speed operation, thus preventing electrical performance of the package from being improved.

Accordingly, semiconductor chip embedding structures with semiconductor chips embedded in circuit boards are developed to shorten an electrical conduction path, decrease signal loss and distortion, and improve high-speed operation.

Figures 1A, 1B:
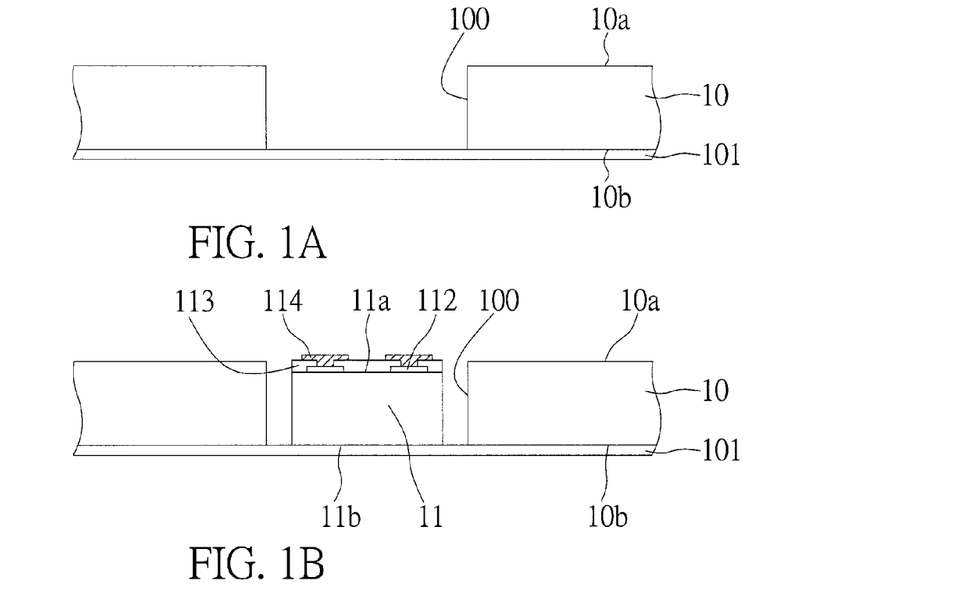
FIGS. 1A to 1D are cross-sectional views showing a conventional fabrication method of a semiconductor chip embedding structure.
Figure 1C:
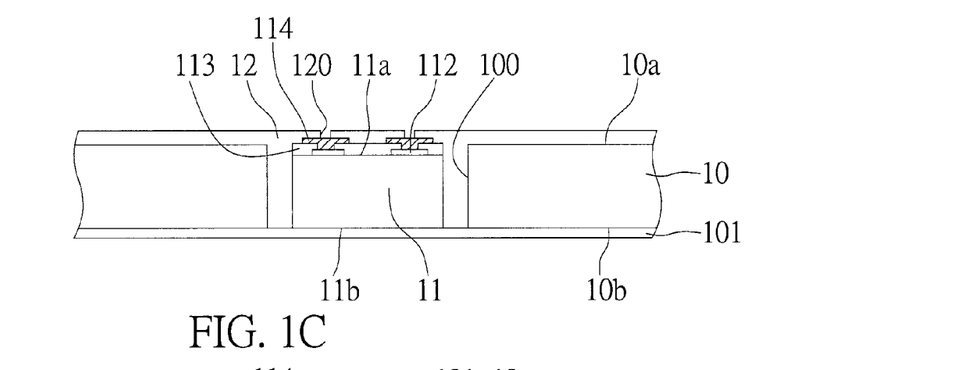
Figure 1D:
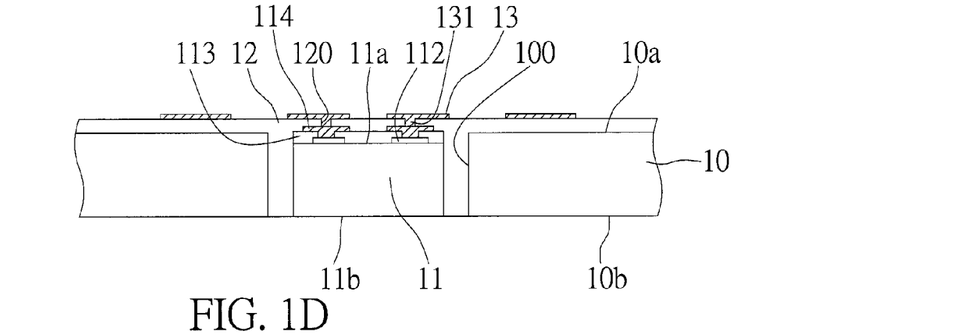

FIGS. 1A to 1D show a fabrication method of a conventional semiconductor chip embedding structure. First, providing a carrier board 10 having a first surface 10a and a second surface 10b opposing the first surface 10a. The carrier board 10 is formed with at least a through cavity 100 penetrating the first surface 10a and the second surface 10b, and a releasing film 101 is formed on the second surface 10b, as shown in FIG. 1A; then, a semiconductor chip 11 is received in the through cavity 100 of the carrier board 10, wherein the semiconductor chip 11 has an active surface 11a and an inactive surface 11b opposing the active surface 11a, the semiconductor chip 11 is mounted on the surface of the releasing film 101 in the through cavity 100 through the inactive surface 11b, the active surface 11a of the semiconductor chip 11 has a plurality of electrode pads 112, a passivation layer 113 is formed on the active surface 11a with the electrode pads 112 exposed therefrom, and metal pads 114 are formed on surfaces of the electrode pads 112, as shown in FIG. 1B; subsequently, a dielectric layer 12 is formed on the first surface 10a of the carrier board 10 and the active surface 11a of the semiconductor chip 11. The dielectric layer 12 is also formed in the spacing between the through cavity 100 and the semiconductor chip 11 so as to fix the semiconductor chip 11 in the through 100. The dielectric layer 12 has a plurality of openings 120 to expose the electrode pads 112 of the semiconductor chip 11, as shown in FIG. 1C; finally, a circuit layer 13 is formed on the dielectric layer 12, conductive structures 131 are formed in the openings 120 of the dielectric layer 12 to be electrically connected to the metal pads 114 of the semiconductor chip 11, and the releasing film 101 is removed, as shown in FIG. 1D.

The semiconductor chip embedding structure fabricated by the aforesaid process shortens the electrical conduction path, decreases signal loss and distortion, and improves high-frequency operation.

However, as there exists a big difference between the CTE (Coefficients of Thermal Expansion) of the semiconductor chip 11 (about 3 ppm/° C.) and the CTE of the dielectric layer 12 (about 50 ppm/° C.), thermal stress is generated on the interface of the two materials in the process, resulting in warpage or delamination, thereby adversely affecting the quality of the semiconductor chip embedding structure, and even ruining the embedding structure or semiconductor chip.

Therefore, there exists a strong need in the art for a semiconductor chip embedding structure to overcome the drawbacks of the aforesaid conventional technology.

SUMMARY OF THE INVENTION

Accordingly, an objective of the present invention is to provide a packaging substrate structure with a semiconductor chip embedded therein, so as to protect a semiconductor chip and a dielectric layer from delamination which might otherwise occur to a packaging substrate structure with a semiconductor chip embedded therein.

In order to attain the above and other objectives, the present invention provides a packaging substrate structure with a semiconductor chip embedded therein, which comprises: a carrier board having a first surface, an opposed second surface, and at least a through cavity; a semiconductor chip received in the through cavity, wherein the semiconductor chip has an active surface and an opposed inactive surface, the active surface has a plurality of electrode pads, the semiconductor chip also having a passivation layer is disposed with openings from which the electrode pads are exposed, and metal pads are disposed formed on the electrode pads; a buffer layer disposed on the first surface of the carrier board and on surfaces of the passivation layer and the metal pads; a first dielectric layer disposed on the buffer layer; and a first circuit layer disposed on the first dielectric layer, the first circuit layer being electrically connected to the metal pads of the semiconductor chip through first conductive structures disposed continuously through the buffer layer and the first dielectric layer.

According to another embodiment, the packaging substrate structure with a semiconductor chip embedded therein comprises: a carrier board having a first surface, an opposed second surface, and at least a through cavity; a semiconductor chip received in the through cavity, wherein the semiconductor chip has an active surface and an opposed inactive surface, the active surface has a plurality of electrode pads, a passivation layer is disposed on the active surface with the electrode pads exposed therefrom, and metal pads are disposed on the electrode pads; a buffer layer disposed on the first surface of the carrier board and on surfaces of the passivation layer, encapsulating periphery of the metal pads and exposing upper surfaces of the metal pads; a first dielectric layer disposed on the buffer layer and the metal pads; and a first circuit layer disposed on the first dielectric layer, the first circuit layer being electrically connected to the metal pads of the semiconductor chip through first conductive structures disposed in the first dielectric layer.

An adhesive layer or a buffer layer can be filled in the spacing between the through cavity and the semiconductor chip so as to fix the semiconductor chip in the through cavity, wherein the adhesive material is a resin material. The carrier board can be an insulating board, a metal board, or a circuit board with a circuit.

The buffer layer is disposed by screen-printing or injection on the first surface of the carrier board and periphery of the metal pads on the active surface of the semiconductor chip, exposing upper surfaces of the metal pads. The CTE (Coefficient of Thermal Expansion) of the buffer layer is between the CTE of the semiconductor chip and the CTE of the dielectric layer. Young's Modulus of the buffer layer is between 1 and 1000 M pa.

A circuit build-up structure can further be disposed on the first dielectric layer and the first circuit layer, which comprises at least a second dielectric layer, a second circuit layer disposed on the second dielectric layer and a plurality of second conductive structures disposed through the second dielectric layer for electrically connecting the first circuit layer. Further, the circuit build-up structure has a plurality of electrically connecting pads disposed on surface thereof, and a solder mask layer is disposed to cover the circuit build-up structure, a plurality of openings being disposed in the solder mask layer to expose the electrically connecting pads of the circuit build-up structure.

Compared with the prior art, the packaging substrate structure with a semiconductor chip embedded therein according to the present invention comprises a buffer layer disposed on surface of the passivation layer on the active surface of the semiconductor chip and the first surface of the carrier board, wherein periphery of the metal pads is encapsulated by the buffer layer and upper surfaces of the metal pads are exposed from the buffer layer. Thus, the thermal stress generated on the interface between the semiconductor chip and the dielectric layer during the process can be released through the buffer layer so as to prevent delamination from occurring.

BRIEF DESCRIPTION OF DRAWINGS

FIG. 2D' is a cross-sectional view of an alternative structure of FIG. 2D; and

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification.

First Embodiment

FIGS. 2A to 2G are cross-sectional views showing a fabrication method of a packaging substrate structure with a semiconductor chip embedded therein according to the first embodiment of the present invention.

Figure 2A:
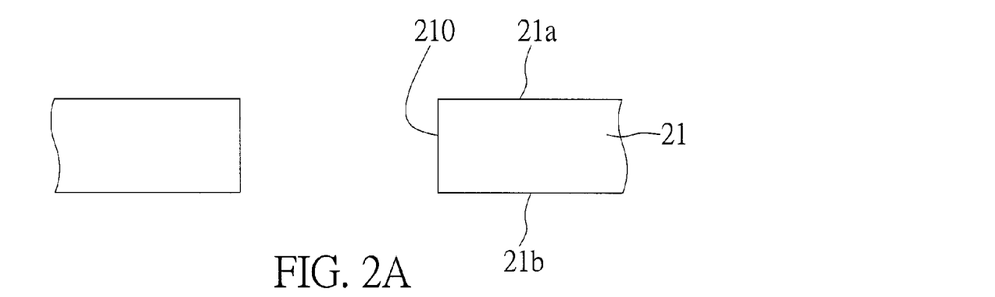
FIGS. 2A to 2G are cross-sectional views showing a fabrication method of a packaging substrate structure with a semiconductor chip embedded therein according to the first embodiment of the present invention.

As shown in FIG. 2A, a carrier board 21 is provided, which has a first surface 21a and a second surface 21b opposed to the first surface 21a. At least a through cavity 210 penetrating the first surface 21a and the second surface 21b is formed in the carrier board 21. The carrier board 21 is an insulating board, a metal board, or a circuit board having a circuit.

Figure 2B:
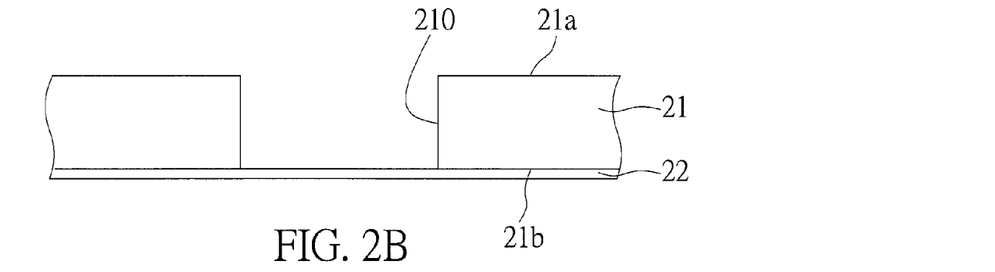

As shown in FIG. 2B, a releasing film 22 is formed on the second surface 21b of the carrier board 21 so as to seal one end of the through cavity 210 of the carrier board 21.

Figure 2C:
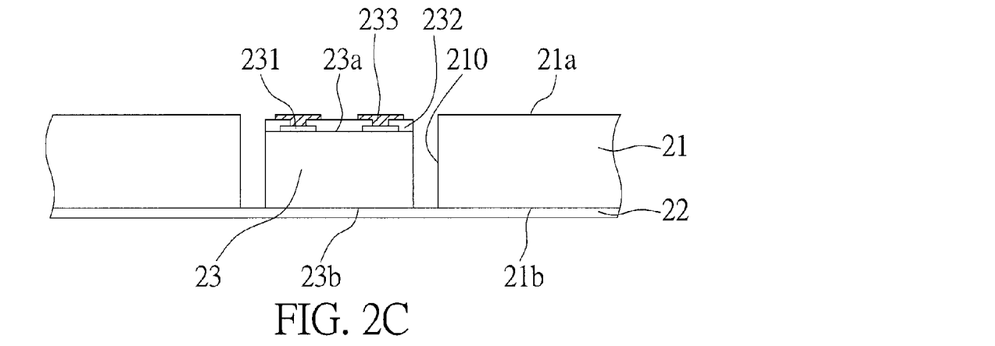

As shown in FIG. 2C, a semiconductor chip 23 is mounted in the through cavity 210. The semiconductor chip 23 has an active surface 23a and an inactive surface 23b opposed to the active surface 23a. The active surface 23a has a plurality of electrode pads 231 and a passivation layer 232 is formed on the active surface 23a with the electrode pads 231 exposed therefrom. Further, metal pads 233 are formed on the electrode pads 231.

Figure 2D:
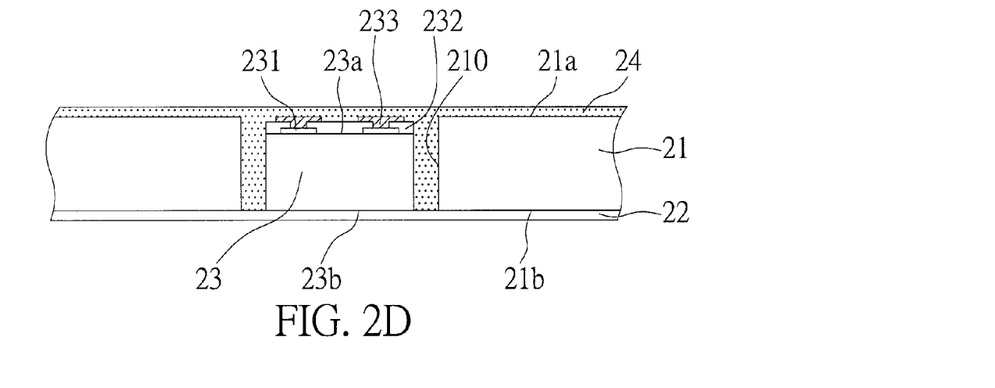

As shown in FIG. 2D, a buffer layer 24 is formed on the first surface 21a of the carrier board 21 and on surfaces of the passivation layer 232 and the metal pads 233 by screen-printing or injection. The buffer layer 24 is made of a polymer having a low coefficient of thermal expansion (CTE), such as about 3-20 ppm/, between the CTE of the semiconductor chip and the CTE of the dielectric layer. The buffer layer 24 also can be made of a polymer having low Young's Modulus such as about 1-1000 Mpa. Meanwhile, the buffer layer 24 can be filled in the spacing between the through cavity 210 of the carrier board 21 and the semiconductor chip 23 according to the process need so as to fix the semiconductor chip 23 in the through cavity 210.

Alternatively, as shown in FIG. 2D', an adhesive material 24a such as a resin material is formed in the spacing between the through cavity 210 of the carrier board 21 and the semiconductor chip 23 to fix the semiconductor chip 23 in the through cavity 210, and then a buffer layer 24 is formed on the first surface 21a of the carrier board 21 and the active surface 23a of the semiconductor chip 23.

Figure 2E:
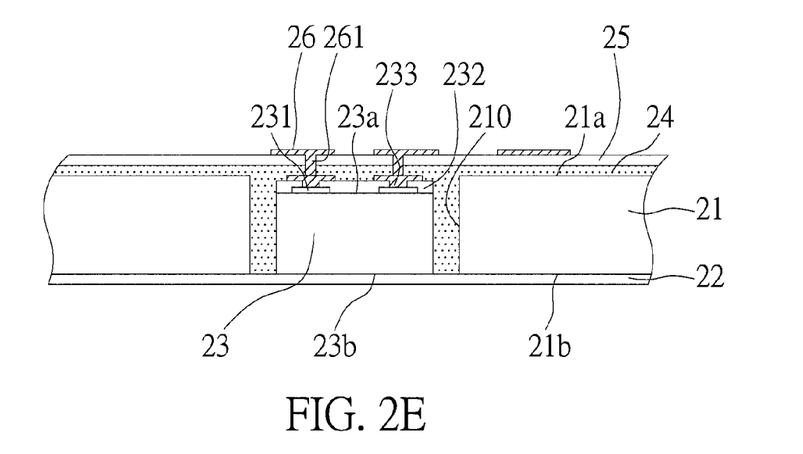

As shown in FIG. 2E, a first dielectric layer 25 is formed on the buffer layer 24. The first dielectric layer 25 may be made of epoxy resin, polyimide, cyanate ester, glass fiber, BT (Bismaleimide triazine), ABF, a mixture of epoxy resin and glass fiber, and so on. Thereafter, a first circuit layer 26 is formed on the first dielectric layer 25, and the first circuit layer 26 is electrically connected to the metal pads 233 of the semiconductor chip 23 through first conductive structures 261 formed in the buffer layer 24 and the first dielectric layer 25.

Figure 2F:
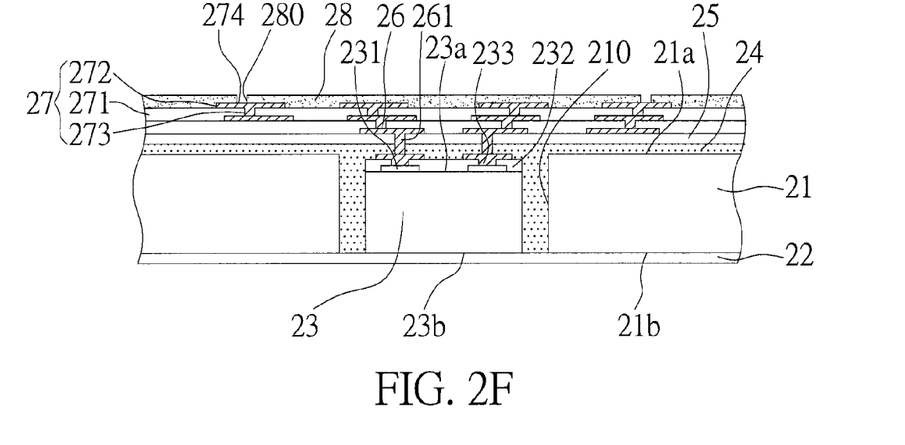

As shown in FIG. 2F, a circuit build-up structure 27 is formed on the first dielectric layer 25 and the first circuit layer 26, wherein the circuit build-up structure 27 comprises at least a second dielectric layer 271, a second circuit layer 272 stacked on the second dielectric layer 271, and second conductive structures 273 formed in the second dielectric layer 271 for electrically connecting the first circuit layer 26. The circuit build-up structure 27 further comprises a plurality of electrically connecting pads 274 formed thereon. Furthermore, a solder mask layer 28 is formed to cover the circuit build-up structure 27, and a plurality of openings 280 is formed in the solder mask layer 28 to expose the electrically connecting pads 274 of the circuit build-up structure 27. The electrically connecting pads 274 can be solder pads on which bumps or pins can be mounted.

Figure 2G:
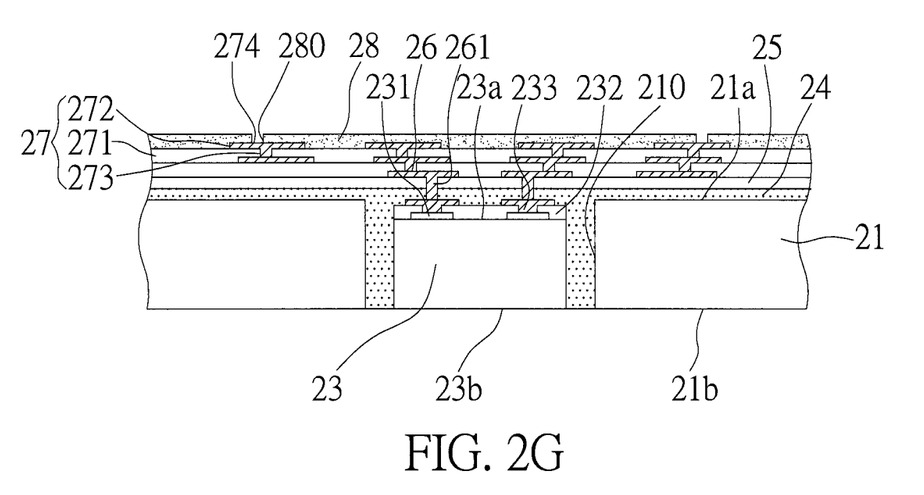

As shown in FIG. 2G, the releasing film 22 is finally removed.

The present invention provides a packaging substrate structure with a semiconductor chip embedded therein, comprising: a carrier board 21 having a first surface 21a, a second surface 21b opposed to the first surface 21a, and at least a through cavity 210; a semiconductor chip 23 received in the through cavity 210, wherein the semiconductor chip 23 has an active surface 23a and an inactive surface 23b opposed to the active surface 23a, the active surface 23a has a plurality of electrode pads 231, a passivation layer 232 is disposed on the active surface 23a with the electrode pads 231 exposed therefrom, and metal pads 233 are disposed on the electrode pads 231; a buffer layer 24 disposed on the first surface 21a of the carrier board 21 and on surfaces of the passivation layer 232 of the semiconductor chip 23; a first dielectric layer 25 disposed on the buffer layer 24; and a first circuit layer 26 disposed on the first dielectric layer 25, the first circuit layer 26 being electrically connected to the metal pads 233 of the semiconductor chip 23 through first conductive structures 261 disposed in the buffer layer 24 and the first dielectric layer 25.

As the thermal stress generated between the semiconductor chip 23 and the first dielectric layer 25 during the process is proportional to the product of the CTE difference and Young's Modulus, the thermal stress can be released, using the buffer layer 24 with a low CTE or low Young's modulus, so as to prevent delamination from occurring and improve the reliability of the semiconductor chip 23 embedded in the carrier board 21.

Second Embodiment

FIGS. 3A to 3D are cross-sectional views showing a fabrication method of a packaging substrate structure with a semiconductor chip embedded therein according to the second embodiment of the present invention. In the present embodiment, the metal pads 233 of the semiconductor chip are exposed from the buffer layer through development and dry etching.

Figure 3A:
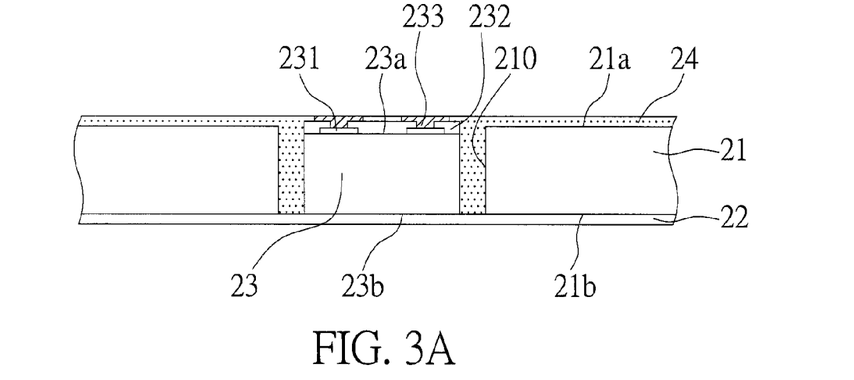
FIGS. 3A to 3D are cross-sectional views showing a fabrication method of a packaging substrate structure with a semiconductor chip embedded therein according to the second embodiment of the present invention.

As shown in FIG. 3A, a structure similar to that of FIG. 2D is provided, the metal pads 233 are exposed form the buffer layer 24 by a development process for example, and the thickness of the buffer layer 24 around the metal pads 233 is adjusted by a dry etching process, such that the periphery of the metal pads 233 is covered with the buffer layer 24, but the upper surfaces of the metal pads 233 are exposed from the buffer layer 24.

Figure 3B:
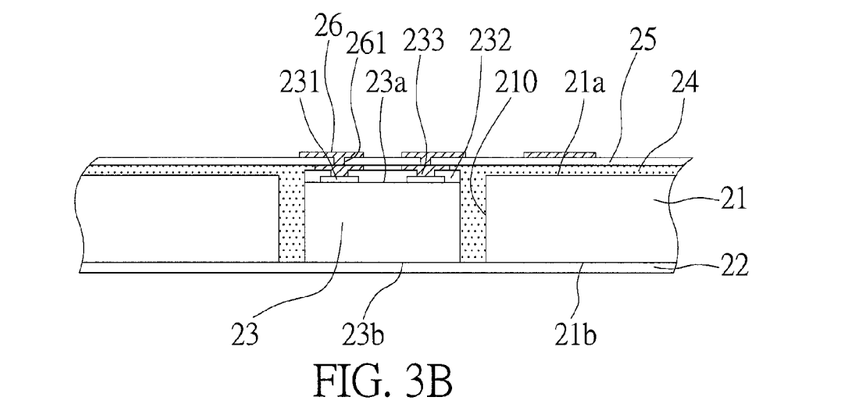

As shown in FIG. 3B, a first dielectric layer 25 is formed on the buffer layer 24 and the metal pads 233. Then, a first circuit layer 26 is formed on the first dielectric layer 25 and electrically connected to the metal pads 233 of the semiconductor chip 23 through first conductive structures 261 formed in the first dielectric layer 25.

Figure 3C:
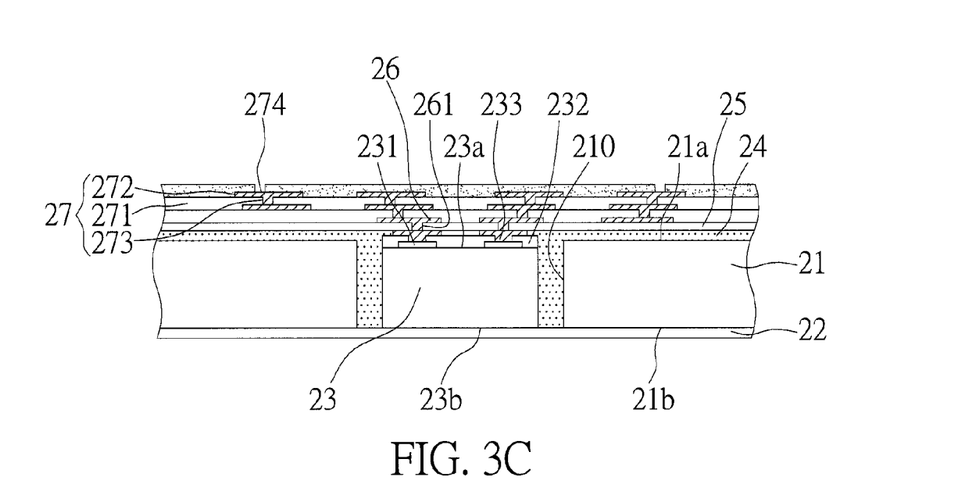

As shown in FIG. 3C, a circuit build-up structure 27 is formed on the first dielectric layer 25 and the first circuit layer 26, wherein the circuit build-up structure 27 has at least a second dielectric layer 271, a second circuit layer 272 stacked on the second dielectric layer 271, and second conductive structures 273 formed in the second dielectric layer 271 for electrical connection with the first circuit layer 26. The circuit build-up structure 27 has a plurality of electrically connecting pads 274 formed thereon. Further, the circuit build-up structure 27 is covered with a solder mask layer 28 thereon, and the solder mask layer 28 has a plurality of openings 280 for exposing the electrically connecting pads 274 of the circuit build-up structure 27. The electrically connecting pads 274 can be solder pads on which bumps or pins are implanted.

Figure 3D:
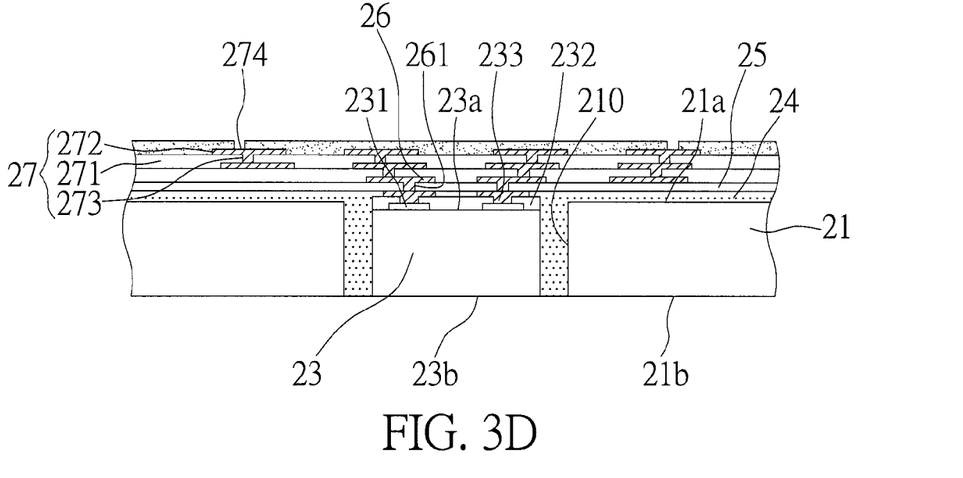

As shown in FIG. 3D, the releasing film 22 is finally removed.

The present invention further provides a packaging substrate structure with a semiconductor chip embedded therein, comprising: a carrier board 21 having a first surface 21a, a second surface 21b opposing the first surface 21a, and at least a through cavity 210; a semiconductor chip 23 received in the through cavity 210, wherein the semiconductor chip 23 has an active surface 23a and an inactive surface 23b opposing the active surface 23a, the active surface 23a has a plurality of electrode pads 231, a passivation layer 232 is disposed on the active surface 23a with the electrode pads 231 exposed therefrom, and metal pads 233 are disposed on the electrode pads 231; a buffer layer 24 disposed on the first surface 21a of the carrier board 21 and on surfaces of the passivation layer 232 of the semiconductor chip 23, encapsulating the periphery of the metal pads 233, and exposing upper surfaces of the metal pads 233; a first dielectric layer 25 disposed on the buffer layer 24 and the metal pads 233; and a first circuit layer 26 disposed on the first dielectric layer 25, the first circuit layer 26 being electrically connected to the metal pads 233 of the semiconductor chip 23 through first conductive structures 261 disposed in the first dielectric layer 25.

Therefore, the present invention mainly involves forming a buffer layer on the active surface of a semiconductor chip and the first surface of a carrier board, and covering the metal pads of the semiconductor chip with the buffer layer. Thus, the thermal stress generated on the interface between the semiconductor chip and the dielectric layer during the process can be released through the buffer layer so as to prevent delamination from occurring to the interface.

The above-described descriptions of the detailed embodiments are only to illustrate the preferred implementation according to the present invention, and it is not to limit the scope of the present invention. All modifications and variations completed by those with ordinary skill in the art should fall within the scope of present invention defined by the appended claims."

What is claimed is:

1. A packaging substrate structure with a semiconductor chip embedded therein, comprising:
    a carrier board having a first surface, an opposed second surface, and at least a through cavity, wherein the semiconductor chip is received in the through cavity and has an active surface and an opposed inactive surface, the active surface has a plurality of electrode pads, and the semiconductor chip has a passivation layer with openings from which the electrode pads are exposed, and metal pads are disposed on the electrode pads;
    a buffer layer disposed on the first surface of the carrier board and on surfaces of the passivation layer formed on the active surface and the metal pads of the semiconductor chip;
    a first dielectric layer disposed on the buffer layer; and
    a first circuit layer disposed on the first dielectric layer, the first circuit layer being electrically connected to the metal pads of the semiconductor chip through first conductive vias disposed continuously through the buffer layer and the first dielectric layer, wherein the CTE (Coefficient of Thermal Expansion) of the buffer layer is between the CTE of the semiconductor chip and the CTE of the dielectric layer, and the CTE of the buffer layer is 3-20 ppm/° C.

2. The packaging substrate structure with a semiconductor chip embedded therein of claim 1, wherein one of an adhesive material and the buffer layer fills in the spacing between the through cavity and the semiconductor chip so as to fix the semiconductor chip in the through cavity.

3. The packaging substrate structure with a semiconductor chip embedded therein of claim 2, wherein the adhesive material is a resin material.

4. The packaging substrate structure with a semiconductor chip embedded therein of claim 1, wherein the carrier board is one of an insulating board, a metal board, and a circuit board with a circuit.

5. The packaging substrate structure with a semiconductor chip embedded therein of claim 1, wherein Young's Modulus of the buffer layer is between 1 and 1000 M pa.

6. The packaging substrate structure with a semiconductor chip embedded therein of claim 1, further comprising a circuit build-up structure disposed on the first dielectric layer and the first circuit layer, wherein the circuit build-up structure has a plurality of second conductive vias for electrical connection with the first circuit layer.

7. The packaging substrate structure with a semiconductor chip embedded therein of claim 6, wherein the circuit build-up structure comprises at least a second dielectric layer, an outmost second circuit layer stacked disposed on the second dielectric layer, and the second conductive vias disposed through the second dielectric layer.

8. The packaging substrate structure with a semiconductor chip embedded therein of claim 7, wherein the outmost second circuit layer has a plurality of electrically connecting pads.

9. The packaging substrate structure with a semiconductor chip embedded therein of claim 8 further comprising a solder mask layer covering the circuit build-up structure, wherein a plurality of openings are disposed in the solder mask layer to expose the electrically connecting pads of the circuit build-up structure.

* * * * *